(12) United States Patent
Wei et al.

(10) Patent No.: US 7,777,562 B2
(45) Date of Patent: Aug. 17, 2010

(54) DISTORTION SUPPRESSION CIRCUIT FOR DIGITAL CLASS-D AUDIO AMPLIFIER

(75) Inventors: Guo Wen Wei, Aurora (CA); Wai Tung Ng, Thornhill (CA)

(73) Assignee: Asahi Kasei EMD Corporation, Tokyo (JP)

( * ) Notice: Subject to any disclaimer, the term of this patent is extended or adjusted under 35 U.S.C. 154(b) by 59 days.

(21) Appl. No.: 12/241,191

(22) Filed: Sep. 30, 2008

(65) Prior Publication Data
US 2009/0160553 A1 Jun. 25, 2009

Related U.S. Application Data

(60) Provisional application No. 61/015,227, filed on Dec. 20, 2007.

(51) Int. Cl.
H03F 3/38 (2006.01)
(52) U.S. Cl. ...................................................... 330/10
(58) Field of Classification Search .................. 330/10, 330/149, 207 A, 251; 375/238; 370/212
See application file for complete search history.

(56) References Cited

U.S. PATENT DOCUMENTS

| 6,466,097 | B1 | 10/2002 | Celant et al. |
| 6,504,427 | B2 | 1/2003 | Midya et al. |
| 6,768,779 | B1 | 7/2004 | Nielsen |
| 6,922,100 | B2 | 7/2005 | Midya et al. |
| 7,057,456 | B2 | 6/2006 | Taura et al. |
| 7,262,658 | B2 | 8/2007 | Ramaswamy et al. |
| 7,348,840 | B2 * | 3/2008 | Magrath et al. ............... 330/10 |
| 7,355,473 | B2 * | 4/2008 | Wu .............................. 330/10 |
| 7,518,442 | B1 * | 4/2009 | Dijkstra et al. ................. 330/10 |
| 2007/0229159 | A1 * | 10/2007 | Krishnan et al. ............ 330/253 |

FOREIGN PATENT DOCUMENTS

JP 06-152269 5/1994

* cited by examiner

*Primary Examiner*—Robert Pascal
*Assistant Examiner*—Khiem D Nguyen
(74) *Attorney, Agent, or Firm*—Vern Maine & Associates

(57) ABSTRACT

A digital Class-D amplifier distortion suppression circuit design is disclosed. A distortion suppression feedback loop is described to improve audio performance by suppressing output stage non-linearity and improving power supply noise rejection achieving reduced THD+N. The feedback loop is placed around the power stage. It forces tracking between the audio band signals at the input and output of the power stage by automatically adjusting the gating signal timing based on sensed effective duty ratio error. Error sensing and compensation are performed using techniques that lend to simple circuit implementation.

20 Claims, 5 Drawing Sheets

DISTORTION SUPPRESSION CIRCUIT FOR DIGITAL CLASS-D AUDIO AMPLIFIER

RELATED APPLICATIONS

This application claims the benefit of U.S. Provisional Application No. 61/015,227, filed Dec. 20, 2007; this application is herein incorporated in its entirety by reference.

FIELD OF THE INVENTION

The invention relates to signal distortion suppression, and more particularly, to a distortion suppression circuit for digital Class-D audio amplifiers.

BACKGROUND OF THE INVENTION

In traditional linear audio amplifiers, DC bias current makes up a large portion of the total power consumption. As a result, the power efficiency is typically limited to around 60%. In contrast, Class-D amplifiers use the much more efficient switch-mode operation and power efficiency as high as 80-90% is readily obtained. Better efficiency means lower heat dissipation. As a result, simple, low cost and compact thermal management systems are usually sufficient. This is one of the main reasons Class-D is often preferred over linear amplifiers. However, Class-D audio amplifiers are sensitive to modulator non-linearity, power stage non-idealities, and power supply noise which make achieving low distortion difficult.

Total Harmonic Distortion plus Noise (THD+N) measures the distortion in the audio signal produced by an amplifier. The lower the THD+N value the better, because a lower THD+N indicates a lower level of distortion and therefore higher audio fidelity. Low distortion in Class-D audio amplifiers is difficult to achieve without the use of feedback.

In analog Class-D amplifiers, the power stage gating signal is produced using analog signal processing. A typical high performance analog Class-D amplifier consists of a power output stage, an analog modulator, a feedback network, and an audio Digital to Analog Converter (DAC). The fidelity of the amplifier is limited by the distortion in the power stage and the modulator. Therefore, to obtain better audio performance, a distortion suppression feedback loop is placed around them. In such a system, the audio DAC is required to have very low THD+N.

In a digital Class-D amplifier, the power stage gating signal is generated using digital signal processing. A typical high performance digital Class-D amplifier consists of a power stage, a digital modulator and a feedback loop. One advantage of using digital signal processing is that the modulator performance is largely unaffected by circuit non-idealities and therefore very low distortion can be achieved. To improve audio fidelity, a distortion suppression feedback loop is placed around the power stage. Since no high performance analog circuits are required, significant cost saving can be realized.

In surveys of high performance Class-D amplifiers, open-loop analog amplifiers typically perform worse than their digital counter parts. However, when feedback is employed, sub 0.002% THD+N performance has been achieved. In contrast, digital designs improve only slightly, with feedback and THD+N values remaining large in comparison. Therefore, the biggest challenge in digital Class-D is breaking the performance limitation, and doing so without significant cost overhead.

SUMMARY OF THE INVENTION

The challenges of low distortion digital Class-D modulator design including a practical silicon implementation are addressed. A hi-fidelity, low-cost and power efficient digital Class-D audio amplifier is described. The design of a digital modulator and methodologies for achieving high efficiency, low distortion and high reliability are included. A novel distortion suppression feedback loop is described to improve audio performance by suppressing output stage non-linearity and improving power supply noise rejection achieving small THD+N. The design is especially suitable for the digital Class-D subclass of Class-D audio amplifiers.

Low distortion has been achieved in the digital modulator by using a known Pseudo-Natural Pulse-Width Modulation (PNPWM) algorithm to compensate for the nonlinearity inherent in the Uniform-Sampling Pulse-Width Modulation (UPWM) sampling process. An efficient and low distortion power stage results from power MOSFET and gate driver design. The open-loop configuration achieves 0.016% THD+N and 88% efficiency.

A drawback of open-loop Class-D amplifiers is the requirement of a well designed power stage and an expensive power supply to achieve low distortion. Although this problem can be alleviated using feedback, for digital Class-D amplifiers, a practical design is difficult to obtain. The described feedback loop monitors the effective duty ratio at the power stage output and adjusts the gate drive timing to counteract the effect of power stage nonidealities and power supply noise. This is accomplished using discrete time signal processing which makes the design simple, yet effective. In the closed loop configuration, a THD+N of 0.01% and distortion suppression up to 38 dB have been demonstrated. Embodiments of the design allows a less expensive power stage and power supply to be used without compromising fidelity. Any digital Class-D based audio system would benefit from employing such technology.

One design embodiment includes a 24-bit, 50 W open-loop digital Class-D amplifier with 0.016% Total Harmonic Distortion plus Noise (THD+N), and 88% efficiency. The feedback circuit monitors the effective duty ratio at the power stage output and adjusts the gate drive timing to counteract the effect of power stage non-idealities and supply noise. In-closed loop, a THD+N of 0.01% and distortion suppression up to 38 dB have been achieved. An open-loop digital Class-D amplifier embodiment is implemented in two parts, the digital modulator fabricated in standard 0.35 µm occupies 4000×4000 µm$^2$, and the power stage fabricated in high voltage 0.35 µm CMOS occupies 2820×3444 µm$^2$.

One embodiment is a system for distortion suppression comprising a modulator feedback loop circuit, wherein a modulator output integrator integrates a modulator output; a power stage output feedback loop circuit, wherein a power stage output integrator integrates a power stage output; and a combiner component, wherein the integrated modulator output and the integrated power stage output combine to produce a duty ratio error.

Another embodiment is a method for distortion suppression using feedback comprising the steps of integrating a modulator output to produce an integrated modulator output; obtaining an effective modulator duty ratio from the integrated modulator output; obtaining a power stage duty ratio; subtracting the power stage duty ratio from the effective modulator duty ratio to obtain a duty ratio error; correcting the effective duty ratio of the power stage output by adding the duty ratio error to the effective modulator duty ratio; and combining two feedback loop outputs to produce a center aligned Pulse Width Modulated (PWM) output.

Embodiments of the invention include a system for distortion suppression, the system comprising feedback, wherein the feedback counteracts effects of power stage nonidealities and power supply noise. The feedback maintains power stage output center alignment by controlling an effective duty ratio. The feedback can also monitor an effective duty ratio at a power stage output and adjusts gate drive timing to counteract the effects of power stage nonidealities and power supply noise. In embodiments, a distortion suppression circuit matches the effective duty ratio of the power stage output to an effective duty ratio of a modulator output. Embodiments also employ discrete time signal processing. The modulator duty ratio can be obtained by integrating the modulator output. In further embodiments, one integrator integrates modulator output and power stage output.

In yet further embodiments, when the modulator output is integrated, output of the integrator increases, and when the power stage output is integrated, the integrator output decreases. At the end of a second period, output of the integrator contains a duty ratio error which corrects for an effective duty ratio of the power stage in the cycle subsequent to the second period. Individual feedback circuit outputs are valid only every other cycle, and the period during which they are valid also alternates. For other embodiments, the individual feedback circuit outputs are combined in an interleaved fashion. Subtraction operations at the input of the integrator are avoided.

Embodiments provide that a reference level is set to about approximately mid-rail. Additionally, reference and feedback signal voltages may vary between about approximately zero and about approximately mid-rail and about approximately mid-rail and about approximately twice mid-rail. A time constant of the integrator is determined by output swing range of the integrator for embodiments. In yet other embodiments, a feedback pull-up circuit prevents ramping during a negative cycle of a feedback node.

A system for digital Class-D amplifier distortion suppression, the system comprising a modulator feedback loop circuit, wherein a modulator output integrator integrates a modulator output; a power stage output feedback loop circuit, wherein a power stage output integrator integrates a power stage output; and a combiner component, wherein the integrated modulator output and the integrated power stage output combine to produce a duty ratio error. The amplifier may be an audio amplifier.

An embodiment provides a method for distortion suppression using feedback, comprising the steps of integrating a modulator output to produce an integrated modulator output; obtaining an effective modulator duty ratio from the integrated modulator output; obtaining a power stage duty ratio; subtracting the power stage duty ratio from the effective modulator duty ratio to obtain a duty ratio error; correcting a power stage output effective duty ratio by adding the duty ratio error to the effective modulator duty ratio; and combining two feedback loop outputs to produce a center aligned Pulse Width Modulated (PWM) output. Embodiment methods suppress distortion in digital Class-D audio amplifiers.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

DETAILED DESCRIPTION

Figure 1:
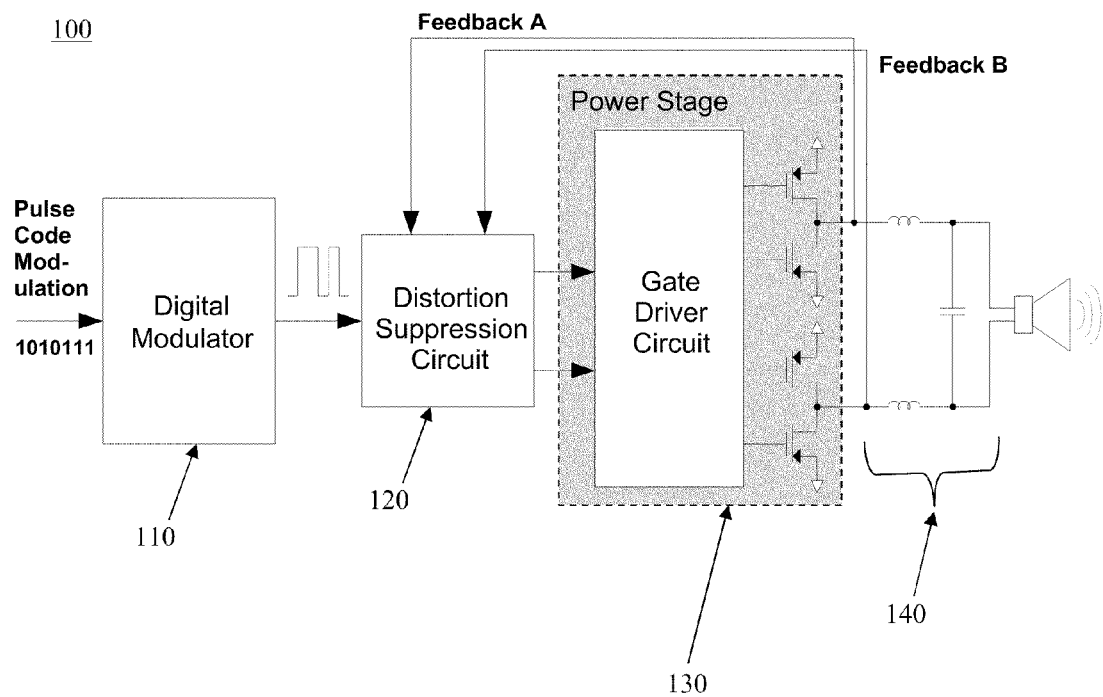
FIG. 1 is a top level block diagram illustrating a digital Class-D amplifier with the feedback circuit configured in accordance with one embodiment of the present invention.

FIG. 1 is a top level block diagram 100 of a digital Class-D audio amplifier portraying an embodiment of the subject feedback circuit. The components to this design comprise: digital modulator 110, distortion suppression circuit 120, and power stage 130. The digital modulator 110 converts audio signals into Pulse-Width Modulated (PWM) pulses that are used to drive the power stage 130. The distortion suppression circuit 120 ensures that the power stage output resembles the digital modulator output as closely as possible using feedback, and the power stage 130 performs the high power audio amplification. FIG. 1 also shows the power stage output filtered by an inductor-capacitor (LC) filter 140 before reaching the speaker.

In digital Class-D audio amplifiers, distortion is predominantly caused by power stage non-ideality and voltage variation/noise on the power source supplying the power stage. In this invention, the distortion introduced by the power stage is suppressed by making the power stage output resemble the digital modulator output as closely as possible. Since the modulator output is low distortion, doing so forces the power stage output to also become low distortion. This concept is not new, but the design that uses this concept to achieve effective distortion suppression is novel. The concept of making the power stage output resemble the modulator output will be further defined.

Figure 2:
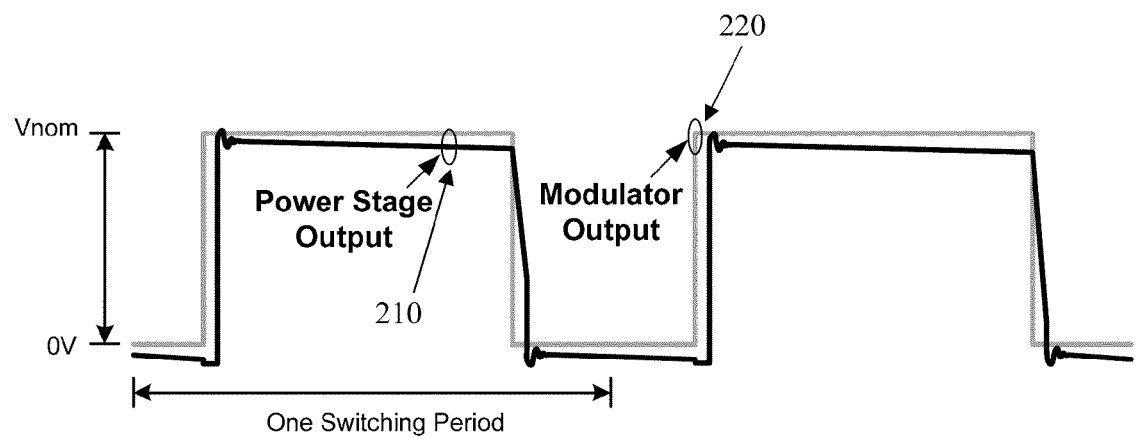
FIG. 2 is a depiction of a modulator output versus a power stage output signal configured in accordance with one embodiment of the present invention.

FIG. 2 shows the pulse-shapes 200 of power stage output 210 and modulator output 220. Significant differences exist and there is no way to dramatically change the power stage output pulse so that it has exactly the same shape as the modulator output. However, there is no need to do that, because the exact pulse shape is not crucial to distortion. Of significance is the effective duty ratio. The effective duty ratio is defined as the average voltage of a pulse during each switching period divided by the nominal supply voltage. If the effective duty ratio of the power stage output and modulator output match closely, low distortion can be achieved. Therefore, the distortion suppression circuit should make the effective duty ratio of the power stage output match the effective duty ratio of the modulator output.

Figure 3:
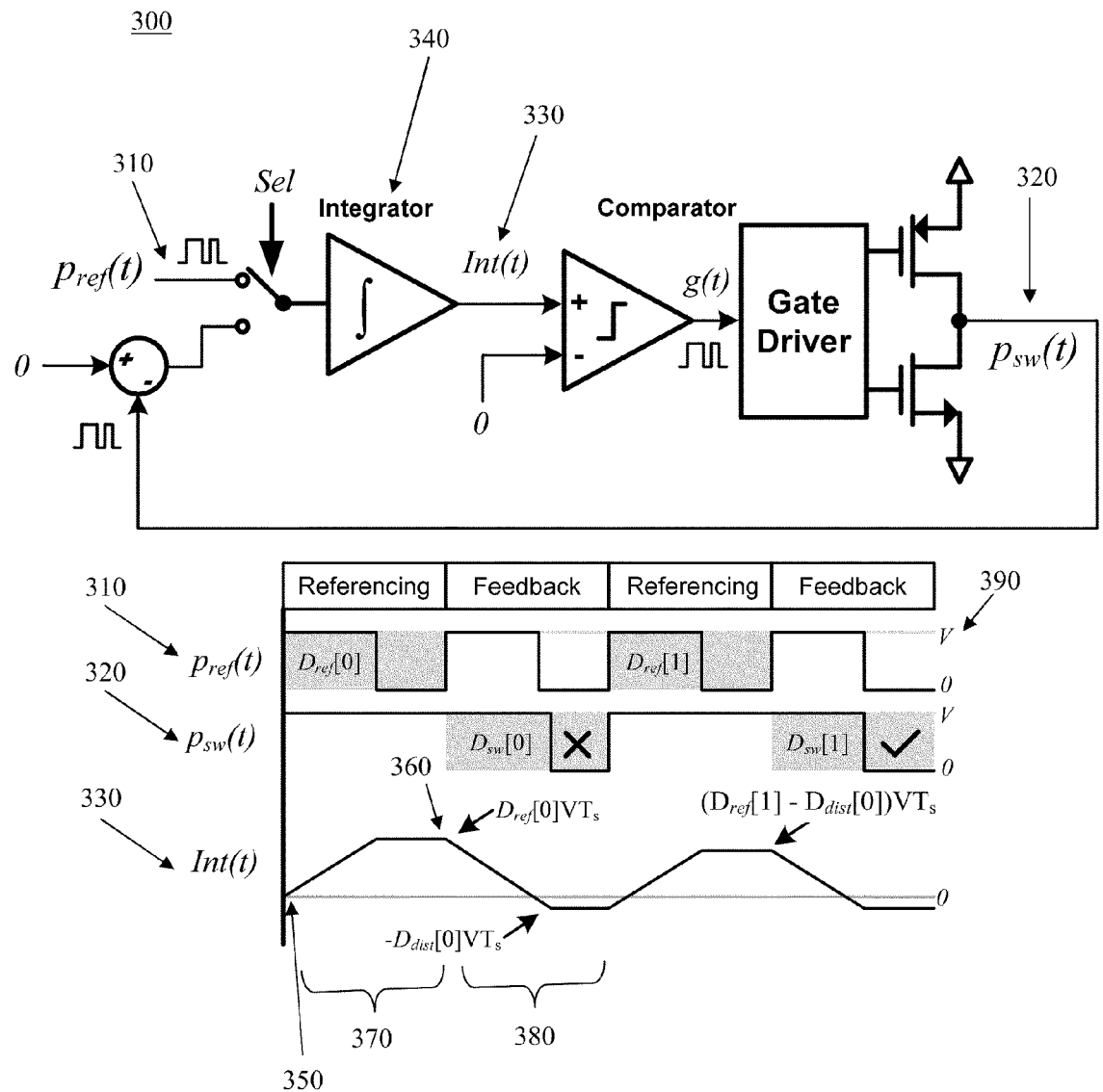
FIG. 3 is a block diagram illustrating a distortion suppression feedback mechanism and timing diagram configured in accordance with one embodiment of the present invention.

In FIG. 3's feedback circuit design 300, the effective duty ratio of the modulator output and power stage output are obtained using integrator circuit 340. For example, when the modulator output is integrated for one switching period, the integrator output equals the effective duty ratio multiplied by the nominal voltage and the switching period length, both of which are constant. Therefore, by sampling the integrator output at the end of each switching period, the effective duty ratio (multiplied by a constant) can be obtained. This is similar to obtaining the effective duty ratio, since the constant only scales the duty ratio by a fixed amount. Feedback then works by comparing the effective duty ratios, and if, for example, the power stage effective duty ratio is too low in the current switching period, then in the next switching period the power stage gating pulse will be lengthened so that the power stage output effective duty ratio will match with that of the modulator more closely. Similar steps will happen in the opposite case where the power stage effective duty ratio is too high. By ensuring the effective duty ratios match, distortion can be effectively suppressed. This novel feedback method of error cancellation/compensation will be summarized next, followed by further details.

The feedback is performed as follows. (1) In the first switching period 370, the modulator duty ratio is obtained by integrating the modulator output. (2) In the second switching period 380, the power stage duty ratio is obtained. (3) The power stage duty ratio is then subtracted from the effective duty ratio of the modulator to obtain the duty ratio error. The subtraction process is simplified by integrating the power stage output using the same integrator used for integrating the modulator output. However, the integration process is manipulated. For example, when the modulator output is integrated, the integrator output increases, and when the power stage output is integrated the integrator output decreases. This way at the end of the second period, the integrator output contains the duty ratio error which is then used in the next cycle to correct for the effective duty ratio of the power stage. This is an embodiment of a novel method of determining the duty ratio error. Before describing how the correction process works, the topic of how the output stage gating pulse is generated and equivalently, how the power stage is controlled will be summarized.

The gating pulse is generated by comparing the integrator 340 output to 0, employing the feedback loop design of FIG. 3. From circuit analysis, it can be seen that the power stage output is high when the integrator 340 output is above 0. The way this design is used to control the power stage is discussed next. At the end 360 of the first period 370, the integrator obtains the effective duty ratio of the modulator output. As mentioned before, when integrating the modulator output, the integrator 340 output increases. Therefore, at the end 360 of the first period 370, the integrator 340 output is also above zero, assuming the integrator 340 output was 0 initially. Consequently, at the beginning of the second period 380, the power stage output is high, and, from analyzing the circuit, it can be seen that this will cause the integrator 340 output to decrease. As time elapses, the integrator 340 output will continue to decrease until the integrator 340 output reaches zero, at which point the power stage is switched off. Since the integrator 340 output at this point represents the difference between the effective duty ratio at the modulator and power stage output, when the integrator 340 output is 0, the power stage effective duty ratio should be equal to that of the modulator. This summarizes an embodiment of power stage output control.

Again considering the feedback network shown in FIG. 3, let the PWM pulse $P_{ref(t)}$ 310 be left edge aligned, and $V_{ref}=V_{sw}=V$ 390. By inspection, it can be seen that the integrator 340 output level Int(t) 330 determines the power stage state: $p_{sw}(t)$ 320 is high when Int(t) 330>0 and is low otherwise. With this established, the feedback loop dynamics are now analyzed. In order to perform feedback, the integrator input alternates between $P_{ref(t)}$ 310 and $-p_{sw(t)}$ 320 every other period. Starting the analysis at t=0 350 when $P_{ref}(t)$ is connected to the integrator, at the end 360 of the first period 370, Int($T_s$) equals $D_{ref}[0]VT_s$ where $D_{ref}[0]$ is the effective duty-ratio of the reference PWM pulse $P_{ref}(t)$ 310 during the first period. At the beginning 360 of the next period 380 when $-p_{sw}(t)$ 320 is connected to the integrator, Int(t) 330 begins to ramp down immediately because at this point Int(t)>0, which makes $-p_{sw}(t)$ 320 equal to −V. The power stage output 320 remains high until Int(t) 330 eventually reaches 0, at which time it switches to the low state. It can be seen that the amount of time the power stage output 320 remained high is determined by the value of $D_{ref}[0]VT_s$ stored in the integrator at the beginning of the period. Effectively, $D_{ref}[0]$ is used in this manner to control the duty-ratio of the power stage. However, due to distortion in the power stage, a duty-ratio error $D_{dist}[0]$ occurs, which prevents $D_{sw}[0]$ and $D_{ref}[0]$ from being equal. This error is stored in the integrator 340 at the end of the period. In the subsequent period when $P_{ref}(t)$ 310 is again connected to the integrator 340, the starting value of Int(t) 330 becomes $-D_{dist}[0]VT_s$ instead of 0, therefore at the end of the period, Int(t) 330 is $(D_{ref}[1]-D_{dist}[0])VT_s$. From this it can be seen that the reference duty ratio stored in the integrator has now been error compensated. In the following period, the error $D_{dist}[0]$ obtained previously is used to cancel the current error, therefore making the difference between $D_{sw}[1]$ and $D_{ref}[1]$ smaller. It can be proved that in general the following holds true:

$$D_{ref}[n]-D_{sw}[n]=D_{dist}[n-1]-D_{dist}[n]$$

As long as $D_{dist}$ is sufficiently slow varying, good tracking between $D_{ref}$ and $D_{sw}$ can be maintained.

The feedback mechanism described above forces the power stage effective duty ratio to better match the modulator effective duty ratio in the subsequent period, because the duty ratio error is being taken into account when controlling the power stage output. More specifically, the duty ratio error obtained is being used to cancel out the duty ratio error that will be occurring in the subsequent cycle. In Class-D amplifiers, the amount of duty ratio error changes relatively slowly from period to period, therefore this approach is very effective.

Figure 4:
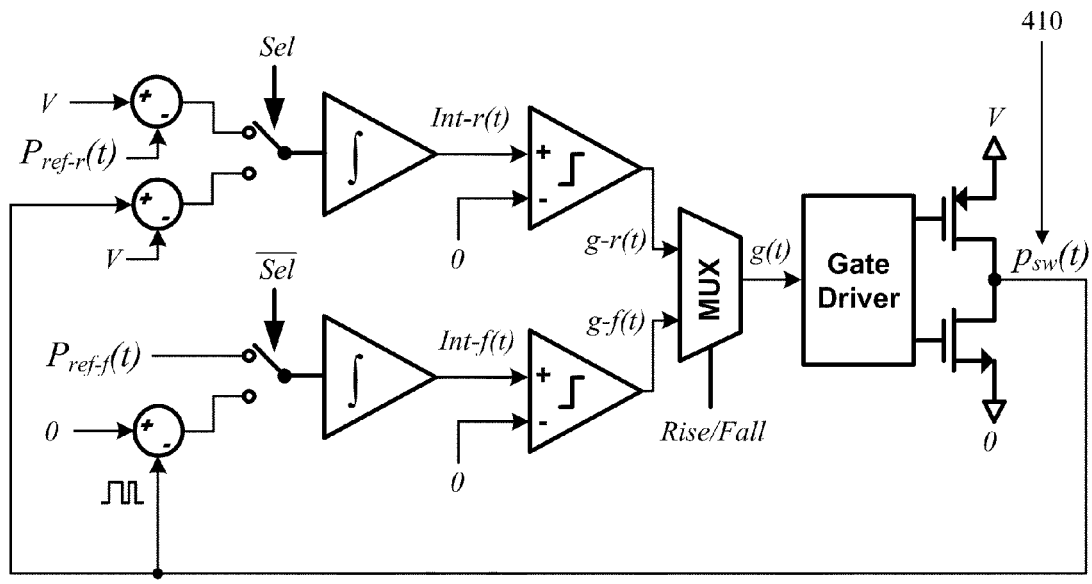
FIG. 4 is a block diagram illustrating a two loop feedback mechanism and timing diagram configured in accordance with one embodiment of the present invention.
Figure 4:
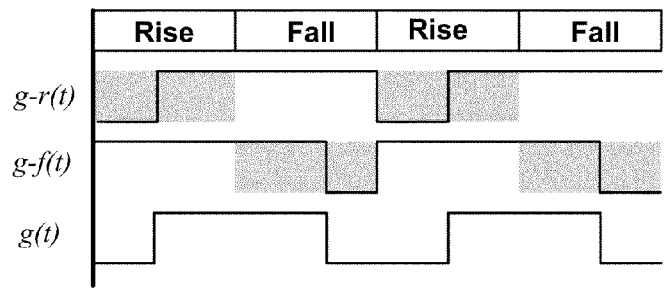

FIG. 4 adopts the feedback structure of FIG. 3 to center-align PWM pulses and employs two loops whose feedback and referencing operations are interleaved 400.

The feedback circuit in FIG. 3 would not typically be used alone in a Class-D amplifier. Referring to the timing diagram in FIG. 3, only the grey portions of the power stage output pulse are valid. The implementation employed in Class-D audio amplifiers is shown in FIG. 4. Here, the power stage output 410 is a center-aligned PWM pulse and two feedback circuits are used to control the rising and falling segments separately. Although the individual feedback circuit outputs are valid only every other cycle, the period during which they are valid also alternates, therefore when their outputs are combined in an interleaved fashion, a center-aligned PWM pulse that is valid everywhere it is produced. Note, a center-aligned PWM is used because it is low distortion and therefore good for Class-D audio amplifiers. The novel feedback method also ensures that center-alignment is maintained at the power stage output which further reduces distortion.

Figure 5:
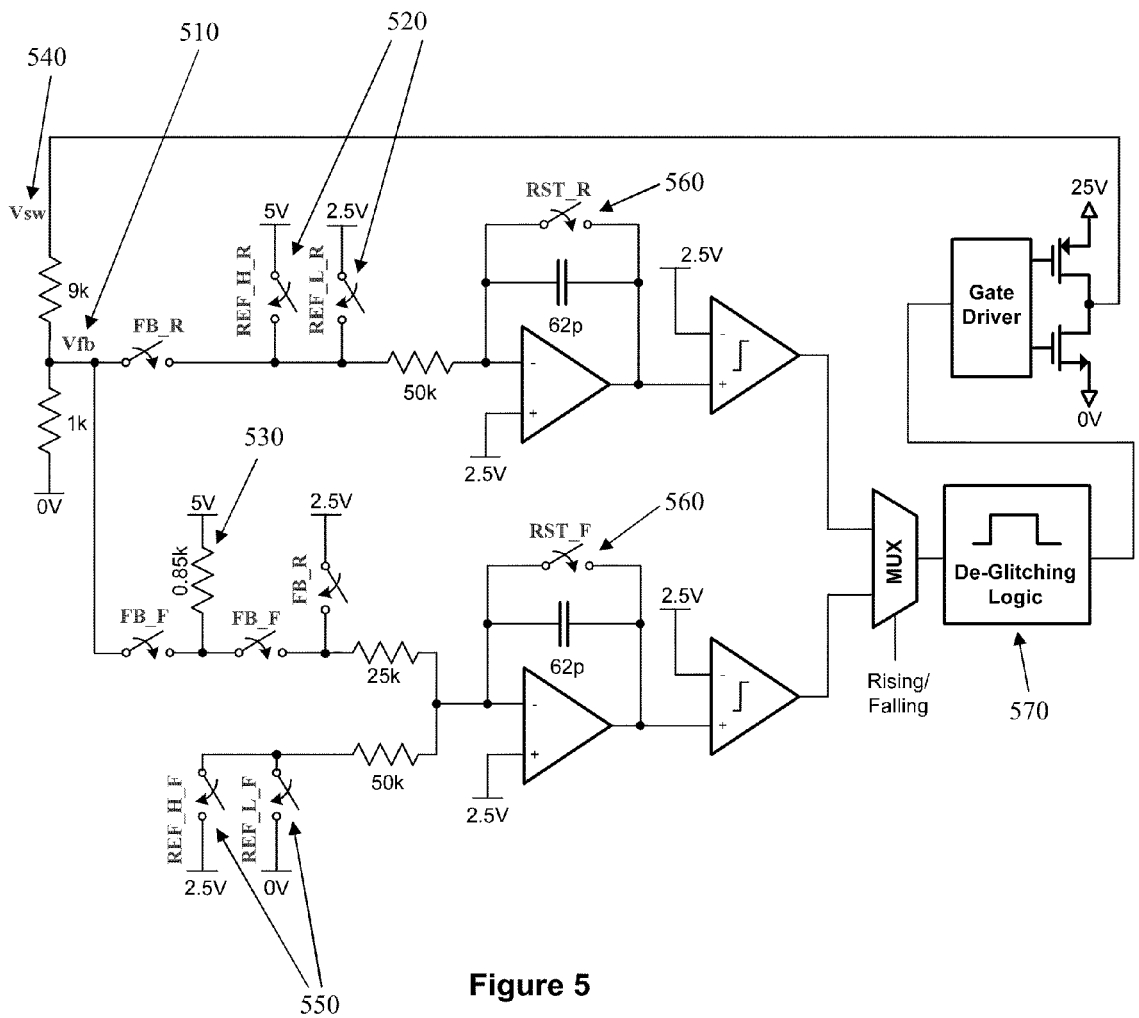
FIG. 5 is a circuit implementation illustrating a feedback mechanism configured in accordance with one embodiment of the present invention.

FIG. 5 is a novel circuit implementation 500 of the feedback loop design 400 of FIG. 4. A challenge is the method of performing the subtraction operations at the input of the integrator. Compared to FIG. 4, a difference is in the generation of the inputs to the integrators. Subtraction circuits are avoided, simplifying the design. To achieve the same functionality, a number of circuit techniques are employed. In FIG. 4, the reference level is 0. That is, the integrator output is ramping down if its input is less than 0 and up otherwise. In the circuit implementation the reference level is set to mid-rail at 2.5V. To make the integrator output ramp in the correct direction when either the reference or the feedback signal is applied, one of the signals is made to swing between 0 to 2.5V and the other between 2.5 and 5V. Since the reference level is at 2.5V, the two signals will cause the integrator output to swing in the opposite directions as required. In FIG. 5, Vfb 510 has a swing of 0 to 2.5V, which is obtained by resistively attenuating the switching node output. For the rising edge feedback circuit at the top of FIG. 5, the reference signal is toggled between 2.5 and 5V using a pair of switches 520. As for the falling edge feedback circuit, in order for it to function, the integrator must ramp either up or down during the positive cycle and stop ramping during the negative cycle. However, the feedback pulse Vfb 510 is close to 2.5V during its positive cycle and therefore the integrator would not ramp when needed. The solution is to introduce a level shift. The simplest way is to use a pull up resistor 530 connected to 5V and sized such that during the negative cycle of Vsw 540, the feedback node Vfb 510 is pulled to 2.5V. This prevents ramping during the negative cycle. During the positive cycle, due to the limitation of the pull up circuit, Vfb 510 cannot swing to 5V, however the input resistance to the integrator can be reduced such that the capacitor current is the same as if Vfb 510 has swung to 5V. A pair of switches 550 is used to generate the falling edge reference pulse which switches between 0 and 2.5V. The integrator time constant is determined by the desired integrator output swing range. The reset switches 560 are used to switch the feedback loop off, and a de-glitching circuit 570 is used to avoid the race condition.

Benefits of this design embodiment include that it is simple and yet effectively reduces the distortion caused by power stage non-idealities and power supply variation/noise as demonstrated by experimental results.

The foregoing description of the embodiments of the invention has been presented for the purposes of illustration and description. It is not intended to be exhaustive or to limit the invention to the precise form disclosed. Many modifications and variations are possible in light of this disclosure. It is intended that the scope of the invention be limited not by this detailed description, but rather by the claims appended hereto.

What is claimed is:

1. A system for distortion suppression, the system comprising feedback, wherein said feedback counteracts effects of power stage nonidealities and power supply noise comprising:
   an integrator, integrating a modulator output to produce an integrated modulator output;
   a subtracting circuit, subtracting a power stage duty ratio from an effective modulator duty ratio to obtain a duty ratio error, wherein said subtracting said power stage duty ratio from said effective modulator duty ratio to obtain said duty ratio error is effected by obtaining an effective modulator duty ratio from said integrated modulator output and obtaining a power stage duty ratio;
   an adding circuit, correcting a power stage output effective duty ratio by adding said duty ratio error to said effective modulator duty ratio; and
   a combining circuit, combining two feedback loop outputs to produce a center aligned pulse width modulated (PWM) output.

2. The system of claim 1 wherein said feedback maintains power stage output center alignment by controlling an effective duty ratio.

3. The system of claim 1 wherein said feedback monitors said effective duty ratio at a power stage output and adjusts gate drive timing to counteract said effects of said power stage nonidealities and said power supply noise.

4. The system of claim 3, wherein a distortion suppression circuit matches said effective duty ratio of said power stage output to said effective duty ratio of a modulator output.

5. The system of claim 1, wherein said system employs discrete time signal processing.

6. The system of claim 4, wherein said modulator duty ratio is obtained by integrating said modulator output.

7. The system of claim 1, wherein one integrator integrates modulator output and power stage output.

8. The system of claim 7, wherein when said modulator output is integrated, output of said integrator increases, and when said power stage output is integrated, said integrator output decreases.

9. The system of claim 8, wherein at the end of a second period, output of said integrator contains a duty ratio error which corrects for an effective duty ratio of said power stage in the cycle subsequent to said second period.

10. The system of claim 1, wherein individual feedback circuit outputs are valid only every other cycle, and the period during which they are valid also alternates.

11. The system of claim 10, wherein said individual feedback circuit outputs are combined in an interleaved fashion.

12. The system of claim 7 wherein subtraction operations at input of said integrator are avoided.

13. The system of claim 1, wherein a reference level is set to about approximately mid-rail.

14. The system of claim 1, wherein reference and feedback signal voltages vary between about approximately zero and about approximately mid-rail and about approximately mid-rail and about approximately twice mid-rail.

15. The system of claim 7, wherein a time constant of said integrator is determined by output swing range of said integrator.

16. The system of claim 1, wherein a feedback pull-up circuit prevents ramping during a negative cycle of a feedback node.

17. A system for digital Class-D amplifier distortion suppression, said system comprising:
    a modulator feedback loop circuit, wherein a modulator output integrator integrates a modulator output;
    a power stage output feedback loop circuit, wherein a power stage output integrator integrates a power stage output;
    a subtracting stage, wherein a power stage duty ratio is subtracted from an effective modulator duty ratio to obtain a duty ratio error; and
    a combiner component, wherein said integrated modulator output and said integrated power stage output combine to produce a duty ratio error, and wherein two feedback loop outputs are combined to produce a center aligned Pulse Width Modulated (PWM) output.

18. The system of claim 17, wherein said amplifier is an audio amplifier.

19. A method for distortion suppression using feedback, comprising the steps of:
    integrating a modulator output to produce an integrated modulator output;
    obtaining an effective modulator duty ratio from said integrated modulator output;
    obtaining a power stage duty ratio; subtracting said power stage duty ratio from said effective modulator duty ratio to obtain a duty ratio error;
    correcting a power stage output effective duty ratio by adding said duty ratio error to said effective modulator duty ratio; and
    combining two feedback loop outputs to produce a center aligned Pulse Width Modulated (PWM) output.

20. The method of claim 19, wherein said distortion suppression is in a digital Class-D audio amplifier.

* * * * *